(12) United States Patent
Lüchinger

(10) Patent No.: US 11,803,084 B2
(45) Date of Patent: Oct. 31, 2023

(54) LIGHT EMITTING COMPONENT AND LIGHT EMITTING DEVICE

(71) Applicant: Avantama AG, Stäfa (CH)

(72) Inventor: Norman Albert Lüchinger, Stäfa (CH)

(73) Assignee: Avantama AG, Stäfa (CH)

( * ) Notice: Subject to any disclaimer, the term of this patent is extended or adjusted under 35 U.S.C. 154(b) by 0 days.

(21) Appl. No.: 18/247,879

(22) PCT Filed: Oct. 8, 2021

(86) PCT No.: PCT/EP2021/077056
§ 371 (c)(1),
(2) Date: Apr. 4, 2023

(87) PCT Pub. No.: WO2022/073859
PCT Pub. Date: Apr. 14, 2022

(65) Prior Publication Data
US 2023/0305337 A1    Sep. 28, 2023

(30) Foreign Application Priority Data

Oct. 8, 2020   (EP) .................................. 20200906

(51) Int. Cl.
*G02F 1/00*          (2006.01)
*G02F 1/1335*        (2006.01)
(Continued)

(52) U.S. Cl.
CPC ........ *G02F 1/133614* (2021.01); *C09K 11/02* (2013.01); *C09K 11/06* (2013.01);
(Continued)

(58) Field of Classification Search
CPC ............................... C09K 11/02; C09K 11/06
See application file for complete search history.

(56) References Cited

U.S. PATENT DOCUMENTS 10,903,441 B2 *  1/2021  Yu ........................ H05B 33/14
2017/0186922 A1   6/2017  Kim et al.
(Continued)

FOREIGN PATENT DOCUMENTS

WO    2017108568 A1    6/2017
WO    2017195062 A1   11/2017
(Continued)

OTHER PUBLICATIONS

Zhang, Xiaoli, et al. "Efficient Light-Emitting Diodes Based on Green Perovskite Nanocrystals with Mixed-Metal Cations." Nano Energy, vol. 30, 2016, pp. 511-516, https://doi.org/10.1016/j.nanoen.2016.10.039. (Year: 2016).*

(Continued)

*Primary Examiner* — Gerald J Sufleta, II
(74) *Attorney, Agent, or Firm* — Renner, Otto, Boisselle & Sklar, LLP

(57) ABSTRACT

A light emitting component comprising a first LED light source for emitting blue light, a second LED light source for emitting red light, and a luminescent layer (100) comprising a solid polymer composition and green luminescent crystals. The solid polymer composition comprises a polymer. The green luminescent crystals are perovskite crystals. The first and the second light source are directed to the luminescent layer. Upon absorption of the light emitted by the first light source, the luminescent crystals emit light of a wavelength in the green light spectrum.

19 Claims, 4 Drawing Sheets

(51) Int. Cl.
*G02F 1/13357* (2006.01)
*C09K 11/02* (2006.01)
*C09K 11/06* (2006.01)

(52) U.S. Cl.
CPC .. *G02F 1/133603* (2013.01); *G02F 1/133606* (2013.01); *G02F 1/133608* (2013.01); *G02F 2201/52* (2013.01)

(56) References Cited

U.S. PATENT DOCUMENTS

| | | | |
|---|---|---|---|
| 2018/0355244 A1* | 12/2018 | Lüchinger | C09K 11/06 |
| 2021/0171829 A1* | 6/2021 | Chiang | C09K 11/02 |
| 2021/0242418 A1* | 8/2021 | Levermore | H10K 77/111 |
| 2021/0261860 A1* | 8/2021 | Boehm | C09K 11/665 |

FOREIGN PATENT DOCUMENTS

| | | |
|---|---|---|
| WO | 2018146561 A1 | 8/2018 |
| WO | 2020130592 A1 | 6/2020 |

OTHER PUBLICATIONS

International Search Report and Written Opinion for corresponding International Application No. PCT/EP2021/077056, dated Dec. 23, 2021.

\* cited by examiner

LIGHT EMITTING COMPONENT AND LIGHT EMITTING DEVICE

This application is a national phase of International Application No. PCT/EP2021/077056 filed Oct. 1, 2021, which claims priority to European Patent Application No. 20200906.4 filed Oct. 8, 2020, each of which is hereby incorporated herein by reference in its entirety.

TECHNICAL FIELD

The invention relates in a first aspect to a light emitting component and in a second aspect to a light emitting device comprising the light emitting component.

BACKGROUND ART

State-of-the-art liquid crystal displays (LCD) or display components comprise quantum dot based components. In particular, a backlight component of such a LCD might comprise a RGB backlight consisting of a red, a blue and a green light. Today, typically quantum dot particles are used to produce the backlight colours of such a backlight component.

The manufacturing of such components faces various challenges. One challenge is the embedding of the nanocrystals into the component. Due to the different chemical properties of the quantum dots, there might be incompatibilities between the various embedded materials comprising the quantum dots or even between quantum dots embedded within the same material. Such incompatibilities might lead to degradation of the materials in the display components and therefore the lifetime of such a display might be affected.

Document US 2017/186922 A1 discloses an electronic device including a light source having a peak emission at a wavelength between about 440 nm to about 480 nm; and a photoconversion layer disposed on the light source. The photoconversion layer includes a first quantum dot which emits red light and a second quantum dot which emits green light. At least one of the first quantum dot and the second quantum dot has a perovskite crystal structure and includes a compound represented by Chemical Formula 1: AB'$X_{3+\alpha}$, wherein A is a Group IA metal, $NR_4^+$, or a combination thereof, B' is a Group IVA metal, X is a halogen, $BF_4^-$, or a combination thereof, and $\alpha$ is 0 to 3.

Document WO 2017/195062 A1 discloses devices and systems including a material including a halide perovskite and/or phosphor to produce and/or communicate using visible light, and the like.

Document WO 2018/146561 A1 discloses compositions and methods relating to light converting luminescent composite material.

Document WO 2017/108568 A1 discloses a luminescent component comprises a first film comprising a first solid polymer composition and a second film comprising a second solid polymer composition. The first solid polymer composition comprises first luminescent crystals. The second solid polymer composition comprises second luminescent crystals. The first luminescent crystals are of size between 3 nm and 3000 nm, and emit red light in response to excitation by light with a shorter wavelength. The second luminescent crystals are of size between 3 nm and 3000 nm, and emit green light in response to excitation by light with a shorter wavelength.

Document WO 2020/130592 A1 relates to a metal halide perovskite light emitting device and a method for manufacturing same. The metal halide perovskite light emitting device, according to the present invention, uses, as a light emitting layer, a perovskite film having a multidimensional crystal structure derived by a proton transfer reaction so that ion transfer is suppressed by a self-assembled shell and a surface defect is removed, thereby improving photoluminescence intensity, light emitting efficiency, and lifetime. Also, a highly efficient light emitting device can be manufactured by injecting a fluorine-based material and a basic material into a PEDOT:PSS conductive polymer, which has been used as a hole injection layer, so as to adjust the acidity thereof and improve the work function of an interface, and by protecting an electrode vulnerable to acid by means of a chemically stable graphene barrier layer.

DISCLOSURE OF THE INVENTION

The problem to be solved by the present invention is therefore to provide a light emitting component that is manufactured in a way to prevent incompatibilities of quantum dot materials in light emitting components, in particular of LCD displays.

The present invention will be described in detail below. It is understood that the various embodiments, preferences and ranges as provided/disclosed in this specification may be combined at will. Further, depending of the specific embodiment, selected definitions, embodiments or ranges may not apply.

Unless otherwise stated, the following definitions shall apply in this specification:

The terms "a", "an" "the" and similar terms used in the context of the present invention are to be construed to cover both the singular and plural unless otherwise in-dicated herein or clearly contradicted by the context. The term "containing" shall include all, "comprising", "essentially consisting of" and "consisting of". Percentages are given as weight-%, unless otherwise indicated herein or clearly contradicted by the context. "Independently" means that one substituent/ion may be selected from one of the named substituents/ions or may be a combination of more than one of the above.

The term "luminescent crystal" (LC) is known in the field and relates to crystals of 2-100 nm, made of semiconductor materials. The term comprises nanocrystals, typically in the range of 2-100 nm and quantum dots, typically in the range of 2-10 nm. Preferably, luminescent crystals are approximately isometric (such as spherical or cubic). Particles are considered approximately isometric, in case the aspect ratio (longest:shortest direction) of all 3 orthogonal dimensions is 1-2. Accordingly, an assembly of LCs preferably contains 50-100% (n/n), preferably 66-100% (n/n) much preferably 75-100% (n/n) isometric nanocrystals.

LCs show, as the term indicates, luminescence. In the context of the present invention the term luminescent crystal includes both, single crystals and polycrystalline particles. In the latter case, one particle may be composed of several crystal domains (grains), connected by crystalline or amorphous phase boundaries. A luminescent crystal is a semiconducting material which exhibits a direct bandgap (typically in the range 1.1-3.8 eV, more typically 1.4-3.5 eV, even more typically 1.7-3.2 eV). Upon illumination with electromagnetic radiation equal or higher than the bandgap, the valence band electron is excited to the conduction band leaving an electron hole in the valence band. The formed exciton (electron-electron hole pair) then radiatively recombines in the form of photoluminescence, with maximum intensity centered around the LC bandgap value and exhibiting photoluminescence quantum yield of at least 1%. In contact with external electron and electron hole sources LC could exhibit electroluminescence.

The term "quantum dot" (QD) is known and particularly relates to semiconductor nanocrystals, which have a diameter typically between 2-10 nm. In this range, the physical radius of the QD is smaller than the bulk excitation Bohr radius, causing quantum confinement effect to predominate. As a result, the electronic states of the QD, and therefore the bandgap, are a function of the QD composition and physical size, i.e. the color of absorption/emission is linked with the QD size. The optical quality of the QDs sample is directly linked with their homogeneity (more monodisperse QDs will have smaller FWHM of the emission). When QD reach size bigger than the Bohr radius the quantum confinement effect is hindered and the sample may not be luminescent any-more as nonradiative pathways for exciton recombination may become dominant. Thus, QDs are a specific subgroup of nanocrystals, defined in particular by its size.

The term "perovskite crystals" is known and particularly includes crystalline compounds of the perovskite structure. Such perovskite structures are known per se and described as cubic, pseudocubic, tetragonal or orthorhombic crystals of general formula M1M2X3, where M1 are cations of coordination number 12 (cuboctaeder) and M2 are cations of coordination number 6 (octaeder) and X are anions in cubic, pseudocubic, tetragonal or orthorhombic positions of the lattice. In these structures, selected cations or anions may be replaced by other ions (stochastic or regularly up to 30 atom-%), thereby resulting in doped perovskites or nonstochiometric perovskites, still maintaining its original crystalline structure. The manufacturing of such luminescent crystals is known, e.g. from WO2018 028869.

The term "polymer" is known and includes organic and inorganic synthetic materials comprising repeating units ("monomers"). The term polymers includes homopolymers and co-polymers. Further, cross-linked polymers and non-cross-linked polymers are included. Depending on the context, the term polymer shall include its monomers and oligomers. Polymers include, by way of example, acrylate polymers, carbonate polymers, sulfone polymers, epoxy polymers, vinyl polymers, urethane polymers, imide polymers, ester polymers, furane polymers, melamine polymers, styrene polymers, norbornene polymers, silicone polymers, silazane polymers and cyclic olefin copolymers. Polymers may include, as conventional in the field, other materials such as polymerization initiators, stabilizers, fillers, solvents.

Polymers may be further characterized by physical parameters, such as polarity, glass transition temperature Tg, Young's modulus and light transmittance.

Transmittance: Typically, polymers used in the context of this invention are light transmissive for visible light, i.e. non-opaque for allowing light emitted by the luminescent crystals, and possible light of a light source used for exciting the luminescent crystals to pass. Light transmittance may be determined by white light interferometry or UV-Vis spectrometry.

Glass transition temperature: (Tg) is a well-established parameter in the field of polymers; it describes the temperature where an amorphous or semicrystalline polymer changes from a glassy (hard) state to a more pliable, compliant or rubbery state. Polymers with high Tg are considered "hard", while polymers with low Tg are considered "soft". On a molecular level, Tg is not a discrete thermodynamic transition, but a temperature range over which the mobility of the polymer chains increase significantly. The convention, however, is to report a single temperature defined as the mid-point of the temperature range, bounded by the tangents to the two flat regions of the heat flow curve of the DSC measurement. Tg may be determined according to DIN EN ISO 11357-2 or ASTM E1356 using DSC. This method is particularly suitable if the polymer is present in the form of bulk material. Alternatively, Tg may be deter-mined by measuring temperature-dependent micro- or nanohardness with micro- or nanoindentation according to ISO 14577-1 or ASTM E2546-15. This method is suited for luminescent components and lighting devices as disclosed herein. Suitable analytical equipment is available as MHT (Anton Paar), Hysitron TI Premier (Bruker) or Nano Indenter G200 (Keysight Technologies). Data obtained by temperature controlled micro- and nanoindentation can be converted to Tg. Typically, the plastic deformation work or Young's modulus or hardness is measured as a function of temperature and Tg is the temperature where these parameters change significantly.

Young's modulus or Young modulus or Elasticity modulus is a mechanical property that measures the stiffness of a solid material. It defines the relationship between stress (force per unit area) and strain (proportional deformation) in a material in the linear elasticity regime of a uniaxial deformation.

According to the present invention, the above described problem is solved by a first aspect of the invention, a light emitting component comprising a first light source for emitting blue light, a second light source for emitting red light and a luminescent layer. The luminescent layer comprises a solid polymer composition and green luminescent crystals. The solid polymer composition comprises a polymer. The green luminescent crystals are perovskite crystals selected from compounds of formula (I):

$$[M^1 A^1]_a M^2_b X_c \qquad \text{(I), wherein:}$$

$A^1$ represents one or more organic cations, in particular formamidinium (FA), $M^1$ represents one or more alkaline metals, in particular Cs, $M^2$ represents one or more metals other than $M^1$, in particular Pb, X represents one or more anions selected from the group consisting of halides, pseudohalides and sulfides, in particular Br, a represents 1-4, b represents 1-2, c represents 3-9, and wherein either $M^1$, or $A^1$, or $M^1$ and $A^1$ being present.

Blue light emitted by the first light source as well as red light emitted by the second light source passes the luminescent layer. Upon absorption of blue light emitted by the first light source, the luminescent crystals emit light of a wavelength in the green light spectrum.

In particular, the luminescent crystals of the second layer emit light with a longer wavelength than the excitation wavelength of the first light source.

In particular, formula (I) describes perovskite luminescent crystals, which, upon absorption of blue light, emit light of a wavelength in the green light spectrum between 500 nm and 550 nm, in particular centered around 527 nm.

In a further advantageous embodiment of the invention, the green luminescent crystals are perovskite crystals of formula (I'):

$$FAPbBr_3 \qquad \text{(I').}$$

In a further advantageous embodiment of the invention, the concentration of M2 in the luminescent layer (100) is 100-1000 ppm, advantageously 300-1000 ppm, very advantageously 500-1000 ppm.

In a further advantageous embodiment of the invention, the luminescent layer (100) has a loading of M2 of 5-200 mg/m², advantageously 10-100 mg/m², very advantageously 20-80 mg/m².

In addition, the luminescent layer has a haze $h_1$ of 10%<$h_1$<80%, in particular of 10<$h_1$<70%, very particular of 10%<$h_1$<60%.

In a further advantageous embodiment of the invention, the luminescent layer has a haze $h_1$ of $h_1$>10%, in particular $h_1$>20%, in particular $h_1$>30%, and $h_1$<80%, in particular $h_1$<70%, very particular $h_1$<60%.

In a further advantageous embodiment of the invention the luminescent layer has a haze $h_1$ of 20%≤$h_1$≤80%, preferably 20%≤$h_1$≤70%, most preferably 30%≤$h_1$≤60%.

Haze in the context of the present invention means transmission haze. Transmission haze is the amount of light that is subject to Wide Angle Scattering that means at an angle greater than 2.5° from the normal incident direction (measured by ASTM D1003; e.g. with Byk gardner haze meter) when passing a transparent material (the luminescent layer in this invention).

The low haze of the luminescent layer has in particular the technical effect that the luminescent perovskite crystals in the luminescent layer are more stable, in particular if they are exposed to blue light. The stability is a result of the reduced multiplex scattering of the blue light in the luminescent layer due to the lower haze.

In addition, a further technical effect of the low haze is the fact that the lower haze leads to a higher display brightness, measured as "light conversion factor" (LCF) of the second layer. The light conversion factor of the luminescent layer refers to the ratio between the green light intensity emitted in perpendicular direction from the luminescent layer and the blue light intensity extincted (e.g. by absorption, reflection or scattering) in perpendicular direction from the luminescent layer.

In a further advantageous embodiment of the invention, the luminescent layer is arranged remotely from the first and/or second light source. Remotely in this context means in particular that the luminescent layer is arranged such that it does not get in contact or it does essentially not get in contact with the first and/or second light source. Remotely can further mean that the luminescent layer is arranged in parallel to the first and/or second light source with a distance between the luminescent layer and the first and/or second light source.

Remotely can further refer to the arrangement of the luminescent layer with an air gap to the first and/or second light source. The gap might also be a vacuum gap or a gap filled with another gas. There might still be touching points or supporting structures between the first and/or the second light source and the luminescent layer.

In an advantageous embodiment of the invention, the first and the second light source are arranged next to each other having the same distance to the luminescent layer. Therefore, the emitted light of the first and second light source hits the luminescent layer with the same or similar intensity and/or in the same angle.

In particular, the first and the second light source are arranged such that they are arranged both on a back side of the luminescent layer, wherein the light emitted from the first and/or second light source hits the luminescent layer. The blue light from the first light source is absorbed partly by the luminescent crystals of the luminescent layer and partly passes the luminescent layer. The red light emitted from the second light source essentially passes the luminescent layer without being absorbed by the luminescent crystals. Therefore, blue, red and green light is emitted on a front side of the luminescent layer.

As mentioned before, the luminescent layer comprises the solid polymer composition and green luminescent crystals. Advantageously, the luminescent crystals are embedded in the solid polymer composition.

1. In an advantageous embodiment, the solid polymer composition comprises a polymer, wherein the polymer (2) is characterized by a molar ratio of the sum of (oxygen+nitrogen) to carbon z, wherein z≤0.9, z≤0.75 in particular z≤0.4, in particular z≤0.3, in particular z≤0.25.

In a further advantageous embodiment of the invention, the polymer comprises an acrylate. Advantageously, the polymer comprises or consists of repeating units selected from the group of cyclic aliphatic acrylates.

In another advantageous embodiment, the polymer is cross-linked and comprises a multi-functional acrylate.

In a further advantageous embodiment, the solid polymer composition has a glass transition temperature $T_g$ of $T_g$≤120° C. (advantageously $T_g$≤100° C., very advantageously $T_g$≤80° C., very preferably $T_g$≤70° C.). Each $T_g$ is measured according to DIN EN ISO 11357-2:2014-07 during the second heating cycle and applying a heating rate of 20K/min, starting at −90° C. up to 250° C. The purging gas was nitrogen (5.0) at 20 ml/min. The DSC system DSC 204 F1 Phoenix (Netzsch) was used. The $T_g$ was determined on the second heating cycle (the first heating from −90° C. to 250° C. showed overlaying effects besides the glass transition).

In a further advantageous embodiment of the invention, the solid polymer composition comprises scattering particles selected from the group consisting of metal oxide particles and polymer particles, preferably selected from the group consisting of $TiO_2$, $ZrO_2$, $Al_2O_3$ and organopolysiloxanes.

In a further advantageous embodiment, the solid polymer composition is configured as a sheet-like polymer. The sheet-like polymer can have the shape of a polymer film with a film thickness of typically 0.001-10 mm, most typically 0.01-0.5 mm. The sheet-like polymer can either be continuous and flat or discontinuous with e.g. a microstructure (e.g. with prism-shape).

In a further advantageous embodiment of the invention, the luminescent layer forms a self-supporting film or part of a self-supporting film.

In a further advantageous embodiment of the invention, the luminescent layer is sandwiched between two barrier layers to form a sandwich structure. Advantageously, the sandwich structure itself forms a self-supporting film or part of a self supporting film.

In particular, such sandwich arrangement refers to an arrangement in a horizontal direction with a barrier layer, the luminescent layer and another barrier layer. The two barrier layers of the sandwich structure can be made of the same barrier layer material or of different barrier layer materials.

The technical effect of the barrier layers is to improve the stability of the luminescent crystals comprised in the luminescent layer, in particular against oxygen or humidity.

In particular, such barrier layers are known in the field; typically comprising a material/a combination of materials with low water vapour transmission rate (WVTR) and/or low oxygen transmission rate (OTR). By selecting such materials, the degradation of the luminescent crystals in the component in response to being exposed to water vapor and/or oxygen is reduced or even avoided. Barrier layers or films preferably have a WVTR<(g)/(m^2*day) at a temperature of 40° C./90% r.h. and atmospheric pressure, more preferably less than 1 (g)/(m^2*day), and most preferably less than 0.1 (g)/(m^2*day).

In one embodiment, the barrier film may be permeable for oxygen. In an alternative embodiment, the barrier film is impermeable for oxygen and has an OTR (oxygen transmission rate)<10 (mL)/(m^2*day) at a temperature of 23° C./90% r.h. and atmospheric pressure, more preferably <1 (mL)/(m^2*day), most preferably <0.1 (mL)/(m^2*day).

In one embodiment, the barrier film is transmissive for light, i.e. with a transmittance for visible light >80%, preferably >85%, most preferably >90%.

Suitable barrier films may be present in the form of a single layer. Such barrier films are known in the field and contain glass, ceramics, metal oxides and polymers. Suitable polymers for the barrier films may be selected from the group consisting of polyvinylidene chlorides (PVdC), cyclic olefin copolymer (COC), ethylene vinyl alcohol (EVOH), high-density polyethylene (HDPE), and polypropylene (PP); suitable inorganic materials may be selected from the group consisting of metal oxides, SiOx, SixNy, AlOx. Most preferably, a polymer humidity barrier material contains a material selected from the group of PVdC and COC.

Most advantageously, a polymer oxygen barrier material contains a material selected from EVOH polymers.

Suitable barrier films may be present in the form of multilayers. Such barrier films are known in the field and generally comprise a substrate, such as PET with a thickness in the range of 10-200 μm, and a thin inorganic layer comprising materials from the group of SiOx and AlOx or an organic layer based on liquid crystals which are embedded in a polymer matrix or an organic layer with a polymer having the desired barrier properties. Possible polymers for such organic layers comprise for example PVdC, COC, EVOH.

In one embodiment, the blue emitting and red emitting light sources are LEDs.

In a further embodiment, the blue emitting light source and the red emitting light source are individual light emitting diodes (LEDs).

In a further embodiment, the blue emitting light source and the red emitting light source are electroluminescent light sources, e.g. light emitting diodes (LEDs).

In a further embodiment the blue emitting light source is an LED chip comprising gallium nitride and the red emitting light source is an LED chip comprising gallium indium phosphide.

A second aspect of the invention refers to a light emitting device, in particular a liquid crystal display (LCD), comprising the light emitting component according to the first aspect.

An advantageous embodiment of the light emitting device comprises an array of light sources and the luminescent layer. The array of light sources comprises more than one first light source and more than one second light source. Advantageously, the array of light sources comprises pairs of first and second light sources. The term pairs refers thereby to an arrangement of a first and second light sources that is repeatingly arranged in the array.

In particular, the array of light sources and/or the luminescent layer extend essentially over the full area of the liquid crystal display.

The pairs of first and second light sources are in particular arranged on the backside of the with one luminescent layer, such that the pairs of first and second light source emit light towards the luminescent layer.

In a further advantageous embodiment of the invention, the light emitting device comprises a diffusor plate or diffusor film that is arranged between the array of light sources and the luminescent layer.

In a further advantageous embodiment of the invention, a light guide plate and a diffusor film are arranged between the array of light sources and the luminescent layer. Advantageously, the light emitted from the light sources enters the light guide plate in an angle of 90° in respect of the light that is emitted by the light guide plate to the diffusor film and finally excites the luminescent crystals in the luminescent layer.

Advantageously, the light emitted from the light sources enters the diffusor plate or film in an angle of 0° in respect of the light that is emitted by the light guide plate to the diffusor sheet and finally excites the luminescent crystals in the luminescent layer.

In a further advantageous embodiment of the invention, the one or more of the light sources of the array are each adapted to switch between on and off with a frequency f of f≥150 Hz, preferably of f≥300 Hz, very preferably of f≥600 Hz.

Other advantageous embodiments are listed in the dependent claims as well as in the description below.

BRIEF DESCRIPTION OF THE DRAWINGS

The invention will be better understood and objects other than those set forth above will become apparent from the following detailed description thereof. Such description makes reference to the annexed drawings, wherein:

FIG. 1a shows an emission spectrum of a first and a second light source;

FIG. 1b shows a schematic of the first and the second light source that correspond to the emission spectrum of FIG. 1a;

MODES FOR CARRYING OUT THE INVENTION

Figure 1:
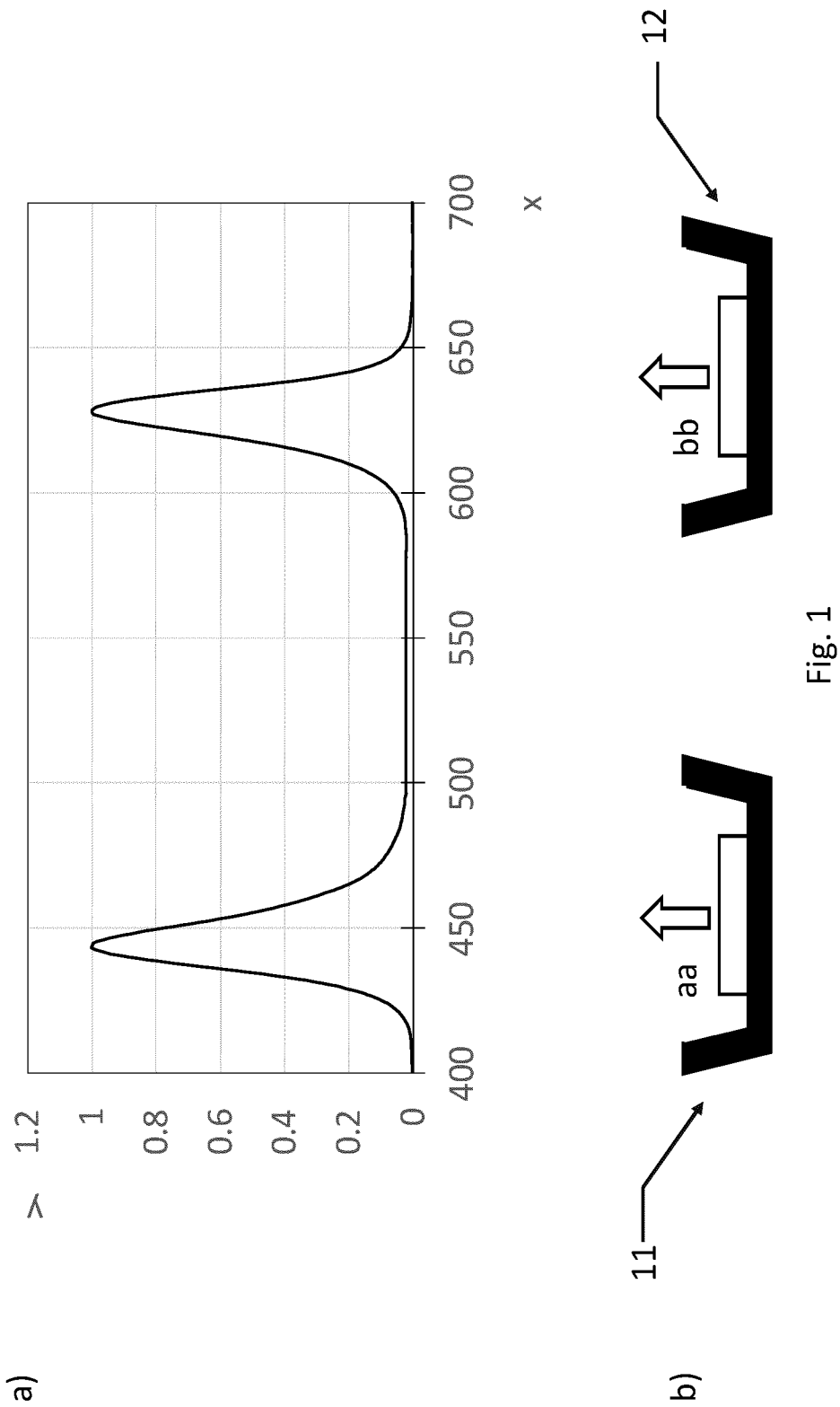

Embodiments, examples, experiments representing or leading to embodiments, aspects and advantages of the invention will be better understood from the following detailed description thereof. Such description makes reference to the annexed drawings, wherein:

FIG. 1a shows an emission spectrum of a first light source 11 for emitting blue light aa and a second light source 12 for emitting red light bb.

As expected, the emission spectrum shows a peak around 440 nm for the blue light aa and around 630 nm for the red light bb.

FIG. 1b shows a schematic of the first light source 11 for emitting blue light aa and a second light source 12 for emitting red light bb.

Figure 2:
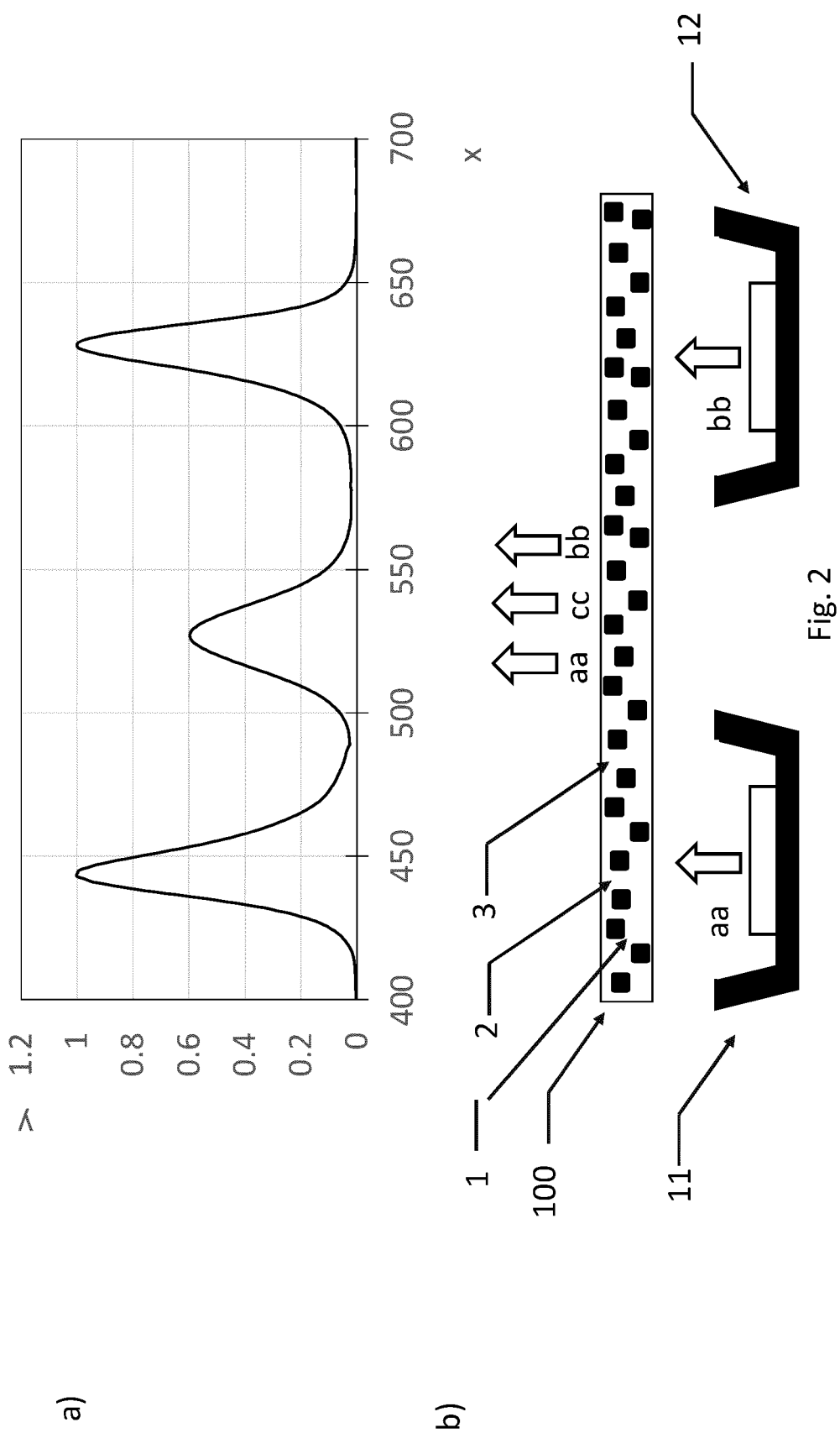
FIG. 2a shows an emission spectrum of an embodiment of a light emitting component.
FIG. 2b shows a schematic of the light emitting component that corresponds to the emission spectrum of FIG. 2b.

FIG. 2a shows an emission spectrum of a light emitting component according to a first embodiment of the invention.

FIG. 2b shows a schematic of a light emitting component according to an embodiment of the invention. The light emitting component comprises a first light source 11 for emitting blue light aa and a second light source 12 for emitting red light bb. In addition, the light emitting component comprises a luminescent layer 100 comprising a solid polymer composition and green luminescent crystals 1. The solid polymer composition comprises a polymer 2. The green luminescent crystals are perovskite crystals selected from compounds of formula (I).

The light emitted by the first 11 and the second 12 light source passes the luminescent layer. Upon absorption of light emitted by the first light source 11, the luminescent crystals 20 emit light of a wavelength in the green light spectrum cc. The luminescent layer 100 has a haze $h_1$ of $10\% < h_1 < 100\%$.

Advantageously, the green luminescent crystals 1 are perovskite crystals of formula (I').

Further advantageously, the concentration of $M^2$ in the luminescent layer 100 can be 100-1000 ppm, in particular 300-1000 ppm, very particular 500-1000 ppm.

Further advantageously, the luminescent layer 100 can have a concentration of $M^2$ of 5-200 mg/m$^2$, in particular 10-100 mg/m$^2$, very particular 20-80 mg/m$^2$.

Further advantageously, the luminescent layer 100 might have haze h1 of h1<80%, in particular of h1<70%, very particular of h1<60%.

In a further advantageous embodiment of the invention the luminescent layer has a haze $h_1$ of $20 \leq h_1 \leq 80\%$, preferably $20 \leq h_1 \leq 70\%$, most preferably $30 \leq h_1 \leq 60\%$ Further advantageously, the luminescent layer 100 might be arranged remotely from the first light source 11 and/or from the second light source 12.

Further advantageously, the solid polymer composition can be characterized by a molar ratio of the sum of (oxygen+nitrogen) to carbon z, wherein $z \leq 0.9$, $z \leq 0.75$ in particular $z \leq 0.4$, in particular $z \leq 0.3$, in particular $z \leq 0.25$.

Further advantageously, the solid polymer composition might comprise an acrylate, very particular wherein the polymer 2 comprises a cyclic aliphatic acrylate.

Further advantageously, the solid polymer composition might have a glass transition temperature $T_g$ of $T_g \leq 120°$ C., in particular of $T_g \leq 100°$ C., in particular of $T_g \leq 80°$ C., in particular $T_g \leq 70°$ C.

In a further advantageous embodiment of the invention, the solid polymer composition might comprise scattering particles selected from the group consisting of metal oxide particles and polymer particles, preferably selected from the group consisting of $TiO_2$, $ZrO_2$, $Al_2O_3$ and organopolysiloxanes.

In a further advantageous embodiment, the luminescent layer 100 might form a self-supporting film or part of a self-supporting film.

Figure 3:
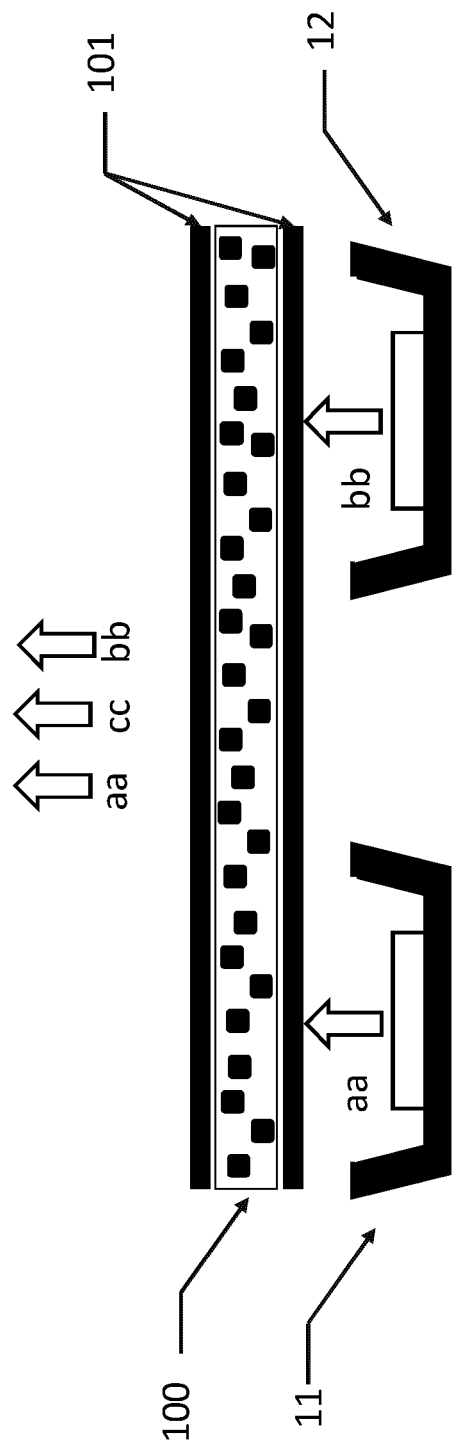
FIG. 3 shows a schematic of a further embodiment of the light emitting component.

FIG. 3 shows a further embodiment of the light emitting component. In addition to the component shown in FIG. 2b, the light emitting component in FIG. 3 comprises barrier layers 101, wherein the luminescent layer 100 is sandwiched between the barrier layers 101. In particular, such a sandwich structure might form a self-supporting layer or part of a self-supporting layer.

Figure 4:
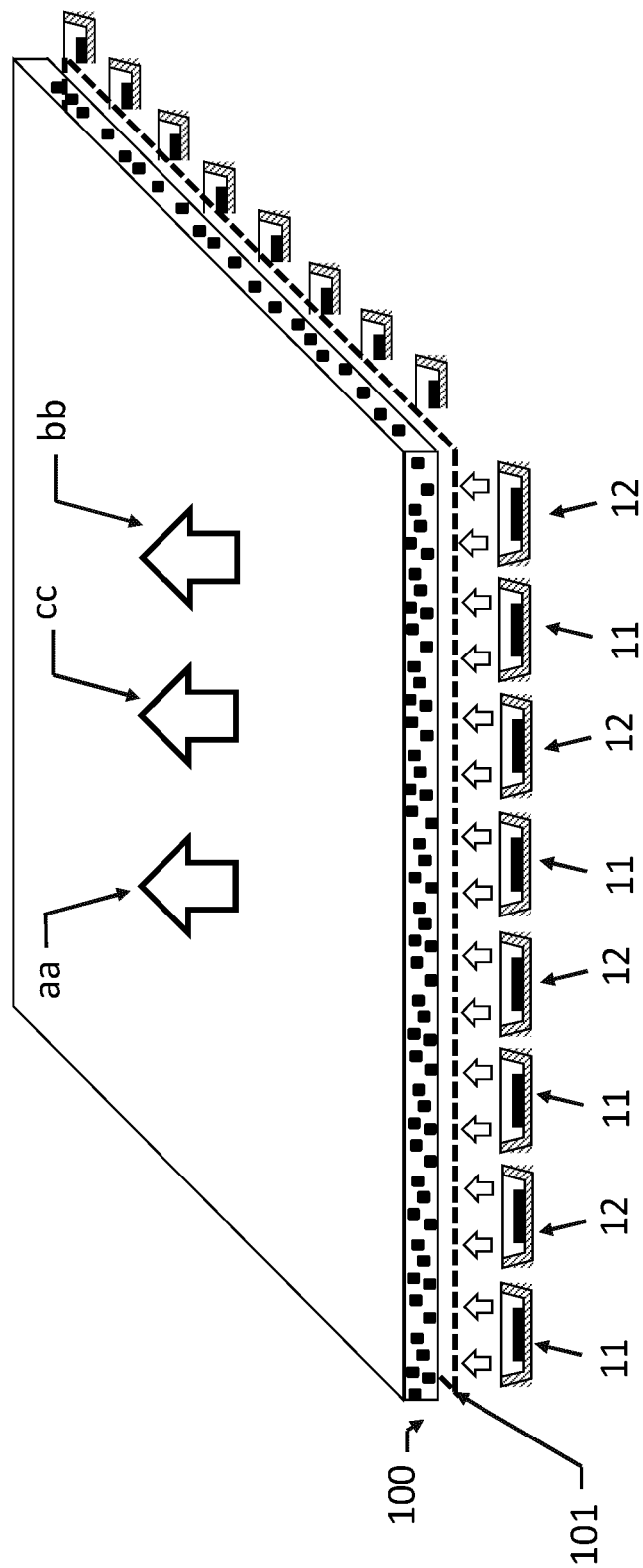
FIG. 4 shows a schematic of an embodiment of a light emitting device.

FIG. 4 shows a schematic of an embodiment of a light emitting device according to a second aspect of the invention. The light emitting component as shown in FIG. 2b and FIG. 3 is integrated into the light emitting device. The light emitting device comprises an array of light sources and the luminescent layer 100. The array of light sources comprises more than one first light source 11 and more than one second light source 12.

Advantageously, the array of light sources comprises pairs of first 11 and second 12 light sources, arranged next to each other, as shown in the embodiment in FIG. 4.

Advantageously, the array of light sources and/or the luminescent layer 100 extend essentially over the full area of the liquid crystal display.

In a further advantageous embodiment the light emitting device might comprise a diffusor plate or diffusor film 101 that is arranged between the array of light sources and the luminescent layer 100.

EXPERIMENTAL SECTION

Example 1: Preparation of a Backlight Unit for a LCD Display by Using a Component as Described Herein FIG. 1b shows the schematic of a component of an array for which the emission spectrum was measured an is shown in FIG. 1a. The component in FIG. 2b comprises a first light source 11 for emitting blue light aa and a second light source 12 for emitting red light bb.

The emission spectrum of the component shows peaks in the visible blue and red range of the spectrum.

To measure the data, a 2D-array of 60 individual blue LEDs based on gallium nitride and 60 individual red LEDs based on aluminium gallium indium phosphide was used.

Example 2

The array from Example 1 was taken and additionally, a diffuser plate is placed on top of the array of light sources. The diffuser plate serves to homogeneously distribute the generated light of the LEDs. a green remote perovskite QD film (self-supporting film) is placed on top (only loose placement; no gluing or similar). Then two crossed prism films (crossed BEFs) and a brightness enhancement film (DBEF) are placed on top of the green perovskite film (not shown in the Figure). The emission spectrum of the complete backlight structure is measured with a spectrometer (Konica Minolta CS-2000) showing blue, red and green emission peaks, as shown in FIG. 2a.

Example 3: Preparation of a Green Remote Perovskite QD Film as a Self-Supporting Film, with Low Haze $h_1$ and Low $T_g$ Green perovskite QDs with composition formamidinium lead tribromide ($FAPbBr_3$) are synthesized in toluene as follows: Formamidinium lead tribromide ($FAPbBr_3$) was synthesized by milling $PbBr_2$ and FABr. Namely, 16 mmol $PbBr_2$ (5.87 g, 98% ABCR, Karlsruhe (DE)) and 16 mmol FABr (2.00 g, Greatcell Solar Materials, Queanbeyan, (AU)) were milled with Yttrium stabilized zirconia beads (5 mm diameter) for 6 h to obtain pure cubic $FAPbBr_3$, confirmed by XRD. The orange $FAPbBr_3$ powder was added to Oleylamine (80-90, Acros Organics, Geel (BE)) (weight ratio $FAPbBr_3$:Oleylamine=100:15) and toluene (>99.5%, puriss, Sigma Aldrich). The final concentration of $FAPbBr_3$ was 1 wt %. The mixture was then dispersed by ball milling using yttrium stabilized zirconia beads with a diameter size of 200 µm at ambient conditions (if not otherwise defined, the atmospheric conditions for all experiments are: 35° C., 1 atm, in air) for a period of 1 h yielding an ink with green luminescence.

Film formation: 0.1 g of the green ink was mixed with an UV curable monomer/crosslinker mixture (0.7 g FA-513AS, Hitachi Chemical, Japan/0.3 g Miramer M240, Miwon, Korea) containing 1 wt % photoinitiator Diphenyl(2,4,6-trimethylbenzoyl) phosphine oxide (TCI Europe, Netherlands) and 2 wt % polymeric scattering particles (Organopolysiloxane, ShinEtsu, KMP-590) in a speed mixer and the toluene was evaporated by vacuum (<0.01 mbar) at room temperature. The resulting mixture contained 500 ppm Pb as measured with inductively coupled optical emission spectroscopy (ICP-OES) and was then coated with 50 micron layer thickness on a 100 micron barrier film (supplier: I-components (Korea); Product: TBF-1007), then laminated with a second barrier film of the same type. Afterwards the laminate structure was UV-cured for 60 s (UVAcube100 equipped with a mercury lamp and quartz filter, Hoenle, Germany). The initial performance of the as obtained green perovskite QD film shows an emission wavelength of 526 nm, a FWHM of 22 nm and a color coordinate in Y-direction ("y-value", CIE1931) of y=0.15 when placed on a blue LED light source (450 nm emission wavelength) with two crossed prism sheets (X-BEF) and one brightness enhancement film (DBEF) on top of the QD film (optical properties measured with a Konica Minolta CS-2000). The haze of the obtained QD film is 50% and the transmittance is 85% (measured with Byk Gardner haze meter). The light conversion factor (LCF; LCF=emitted green intensity (integrated emission peak) divided by the reduction of the blue intensity (integrated emission peak); measured with perpendicular emission of green and blue from the QD film by using a Konica Minolta CS-2000).

The glass transition temperature Tg of the UV-cured resin composition was determined by DSC according to DIN EN ISO 11357-2:2014-07 with a starting temperature of −90° C. and an end temperature of 250° C. and a heating rate of 20 K/min in nitrogen atmosphere (20 ml/min). The purging gas was nitrogen (5.0) at 20 ml/min. The DSC system DSC 204 F1 Phoenix (Netzsch) was used. The $T_g$ was determined on the second heating cycle (the first heating from −90° C. to 250° C. showed overlaying effects besides the glass transition). For the DSC measurement the UV-cured resin composition was removed from the QD film by delaminating the barrier films. The measured Tg of the UV-cured resin composition was 75° C.

The stability of the QD film was tested for 1'000 hours under blue LED light irradiation by placing the QD film into a light box with high blue intensity (supplier: Hoenle; model: LED CUBE 100 IC) with a blue flux on the QD film of 220 mW/cm2 at a QD film temperature of 50° C. The change of optical parameters of the QD film after flux testing for 1'000 hours was measured with the same procedure as for measuring the initial performance (described above). The change of optical parameters were as following:
Change of y-value: from 0.15 to 0.119 (−0.031)
Change of LCF: from 50% to 40% (−10%)
Change of green emission wavelength: from 526 nm to 525 nm (−1 nm)
Change of green FWHM: 0 nm Comparative Example 1 for Example 3: Preparation of a Green Remote Perovskite QD Film with High Haze and Low $T_g$ The procedure was the same as in the previous procedure for the QD film with low haze, except the following parameters were changed:
Pb amount of the whole UV curable acrylate mixture is 200 ppm
12 wt % scattering particles KMP-590 were mixed into the UV curable acrylate mixture to increase the haze of the final QD film.

The as obtained green perovskite QD film showed an emission wavelength of 525 nm, a FWHM of 22 nm ands a y-value of 0.149 (almost identical to the low-haze QD film in experiment 3). The LCF of the QD film is 43%. The haze of the QD film was 98% and the transmittance is 81%. The measured Tg of the UV-cured resin composition was 77° C. It can be seen that the LCF is lower than in experiment 3. A higher haze leads to a lower LCF and a lower haze leads to a higher LCF. Therefore, a lower haze of the QD film is beneficial to have a higher LCF and in turn a higher display efficiency (at specific comparable white point colour coordinates).

The change of optical parameters of the QD film after flux testing for 1'000 hours were as following:
Change of y-value: from 0.149 to 0.058 (−0.091)
Change of LCF: from 43% to 14% (−29%)
Change of green emission wavelength: from 525 nm to 521 nm (−4 nm)
Change of green FWHM: 0 nm These results show that a higher haze of the QD film leads to lower QD film stability under high blue flux compared to example 3 (specifically, the y-value, LCF and emission wavelength are all less stable). Therefore, it is advantageous to have a low haze of the QD film which leads to improved QD film stability under high blue flux in order to have stable colour coordinates and a stable white point during the operating life-time of the display device.

TABLE 1

Summary of the parameter changes after high-flux testing for experiment 3 and comparative example 1:

| Ex. #: haze, Tg | test condition | y-value (−) | PP (nm) | FWHM (nm) | LCF (%) |
|---|---|---|---|---|---|
| Ex. 3, inventive | initial | 0.150 | 526 | 22 | 50 |
| 50% Haze, | 1000 h | 0.119 | 525 | 22 | 40 |
| 75° C. Tg | high flux | | | | |
| | Δ | −0.031 | −1 | 0 | −10 |
| Comparative Ex. 1 | initial | 0.149 | 525 | 22 | 43 |
| 98% Haze, | 1000 h | 0.058 | 521 | 22 | 14 |
| 77° C. Tg | high flux | | | | |
| | Δ | −0.091 | −4 | −0 | −29 |

The inventive luminescent component is characterized by low haze ($h_1$=50%) than the component of comparative example 1 ($h_2$=98%). The data show that the inventive example shows a more stable y-value (higher stability of the film), a more stable LCF value and a substantially increased value of the LCF in general.

Comparative Example 2 for Example 3: Preparation of a Green Remote Perovskite QD Film with Low Haze and High $T_g$ The procedure was the same as in the procedure of example 3, except the acrylate monomer mixture (0.7 g FA-513AS, Hitachi Chemical, Japan/0.3 g Miramer M240, Miwon, Korea) was replaced by the following acrylate monomer mixture:
0.7 g FA-DCPA, Hitachi Chemical, Japan/0.3 g FA-320M, Hitachi Chemical, Japan.

The as obtained green perovskite QD film showed an emission wavelength of 526 nm, a FWHM of 22 nm and a y-value of 0.153 (almost identical to the low-haze QD film in experiment 3). The LCF of the QD film is 49%. The haze of the QD film was 51% and the transmittance is 85%. The measured Tg of the UV-cured resin composition was 144° C.

The change of optical parameters of the QD film after flux testing for 1'000 hours were as following:
Change of y-value: from 0.153 to 0.068 (−0.085)
Change of LCF: from 49% to 21% (−28%)
Change of green emission wavelength: from 526 nm to 525 nm (−1 nm)
Change of green FWHM: 0 nm These results show that a high $T_g$ of the solid polymer of the QD film (self-supporting film) leads to lower QD film stability under high blue flux. Therefore it is advantageous to have a low $T_g$ of the QD film which leads to improved QD film stability under high blue flux in order to have stable colour coordinates and a stable white point during the operating life-time of the display device.

TABLE 2

Summary of the parameter changes after high-flux testing for experiment 3 and comparative example 2:

| Ex. #: haze, Tg | test condition | y-value (−) | PP (nm) | FWHM (nm) | LCF (%) |
|---|---|---|---|---|---|
| Ex. 3, inventive 50% Haze, 75° C. Tg | initial | 0.150 | 526 | 22 | 50 |
| | 1000 h high flux | 0.119 | 525 | 22 | 40 |
| | Δ | −0.031 | −1 | −0 | −10 |
| Comparative Ex. 2 51% Haze, 144° C. Tg | initial | 0.153 | 526 | 22 | 49 |
| | 1000 h high flux | 0.068 | 525 | 22 | 21 |
| | Δ | −0.085 | −1 | −0 | −28 |

The inventive luminescent component is characterized by lower $T_g$ ($T_g$=75° C.) than the component of comparative example 2 ($T_g$=144° C.). The data show that the inventive example shows a more stable y-value, a much more stable LCF value (higher stability of the film).

The invention claimed is:

1. A light emitting component comprising
a first LED light source for emitting blue light,
a second LED light source for emitting red light,
a luminescent layer comprising
 a solid polymer composition, and
 green luminescent crystals,
wherein the solid polymer composition comprises a polymer, and
wherein the green luminescent crystals are perovskite crystals selected from compounds of formula (I):

$$[M^1 A^1]_a M^2_b X_c \quad (I), \text{ wherein:}$$

$A^1$ represents one or more organic cations,
$M^1$ represents one or more alkaline metals,
$M^2$ represents one or more metals other than $M^1$,
X represents one or more anions selected from the group consisting of halides, pseudohalides and sulfides,
a represents 1-4,
b represents 1-2,
c represents 3-9, and
wherein either $M^1$, or $A^1$, or $M^1$ and $A^1$ being present;
 wherein light emitted by the first and the second light source passes the luminescent layer,
 wherein upon absorption of light emitted by the first light source, the luminescent crystals emit light of a wavelength in the green light spectrum, and
 wherein the luminescent layer has a haze $h_1$ of 10%<$h_1$<80.

2. The light emitting component according to claim 1, wherein the green luminescent crystals are perovskite crystals of formula (I'):

$$FAPbBr_3 \quad (I'),$$

wherein FA is formamidinium.

3. The light emitting component according to claim 1, wherein the concentration of $M^2$ in the luminescent layer is 100-1000 ppm.

4. The light emitting component according to claim 1, wherein the luminescent layer has a loading of $M^2$ of 5-200 mg/m².

5. The light emitting component according to claim 1, wherein the luminescent layer has a haze $h_1$ of 20%<$h_1$<80.

6. The light emitting component according to claim 1, wherein the luminescent layer is arranged remotely from the first light source and/or from the second light source.

7. The light emitting component according to claim 1, wherein the polymer is characterized by a molar ratio of a sum of (oxygen+nitrogen) to carbon z, wherein z≤0.9, z≤0.75.

8. The light emitting component according to claim 1, wherein the polymer is selected from acrylates.

9. The light emitting component according to claim 1, wherein the solid polymer composition has a glass transition temperature $T_g$ of $T_g$≤120° C.

10. The light emitting component according to claim 1, wherein the solid polymer composition comprises scattering particles selected from the group consisting of metal oxide particles and polymer particles.

11. The light emitting component according to claim 1, wherein the luminescent layer forms a self-supporting film or part of a self-supporting film.

12. The light emitting component according to claim 1, wherein the luminescent layer is sandwiched between two barrier layers to form a sandwich structure.

13. A light emitting device comprising a liquid crystal display (LCD) further comprising the light emitting component according to claim 1.

14. The light emitting device according to claim 13, wherein the light emitting component comprises
 an array of light sources, and
 the luminescent layer,
 wherein the array of light sources comprises more than one first light source and more than one second light source.

15. The light emitting device according to claim 13, comprising a diffusor plate or diffusor film that is arranged between the array of light sources and the luminescent layer.

16. The light emitting device according to claim 14,
wherein the array of light sources comprises pairs of first and second light sources, and
wherein the array of light sources and/or the luminescent layer extend essentially over the full area of the liquid crystal display.

17. The light emitting component according to claim 10, wherein the scattering particles are selected from the group consisting of $TiO_2$, $ZrO_2$, $Al_2O_3$ and organopolysiloxanes.

18. The light emitting component according to claim 12, wherein the sandwich structure forms a self-supporting film or part of a self-supporting film.

19. The light emitting component according to claim 1, wherein in the perovskite crystals of formula (I)
 $A^1$ represents formamidinium (FA);
 $M^1$ represents Cs;

$M^2$ represent Pb; and wherein the luminescent layer has a haze $h_1$ of $10\% < h_1 < 60\%$.

* * * * *